United States Patent
Kapolnek et al.

(10) Patent No.: US 6,620,709 B2
(45) Date of Patent: Sep. 16, 2003

(54) FABRICATION OF SEMICONDUCTOR MATERIALS AND DEVICES WITH CONTROLLED ELECTRICAL CONDUCTIVITY

(75) Inventors: David Kapolnek, Santa Barbara, CA (US); Brian Thibeault, Santa Barabara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 10/133,530

(22) Filed: Apr. 11, 2002

(65) Prior Publication Data

US 2002/0173165 A1 Nov. 21, 2002

Related U.S. Application Data

(63) Continuation of application No. 09/644,875, filed on Aug. 23, 2000, now Pat. No. 6,498,111.

(51) Int. Cl.[7] .............................................. H01L 21/31
(52) U.S. Cl. .......................... 438/478; 438/22; 438/47; 438/48
(58) Field of Search .......................... 438/224, 48, 478

(56) References Cited

U.S. PATENT DOCUMENTS

| | | | |
|---|---|---|---|
| 5,834,326 A | * | 11/1998 | Miyachi et al. ................ 438/29 |
| 5,902,393 A | | 5/1999 | Nido et al. ...................... 117/2 |
| 5,930,656 A | * | 7/1999 | Furukawa et al. ........... 438/479 |

FOREIGN PATENT DOCUMENTS

| | | |
|---|---|---|
| EP | 1052705 A1 | 11/2000 |
| JP | 11145518 A | 5/1999 |
| WO | WO9913499 A | 3/1999 |

OTHER PUBLICATIONS

S.J. Pearton et al., Hydrogen in Crystalline Semiconductors, Appl. Phys. A. 43, 153–195 (1987).

N.M. Johnson, et al., Hydrogen Passivation of Shallow–Acceptor Impurities in P–Type GaAs, Phys. Rev. B, 33, 1102 (1986).

G. R. Antell et al., Passivation of Zinc Acceptors in InP By Hydrogen Coming From Arsine During Metalorganic Vapor Phase Epitaxy, Appl. Phys. Lett, 53, 758 (1988).

L.V. Svob et al., Neutralization of Acceptor and Donor Impurities in Hydrogenated CdTe, J. Cryst, Growth, 86, 815, (1988).

T. Zundel And J. Weber, Dissociation Energies of Shallow–Acceptors in P–InP, J. Appl. Phys. 66, 1993, (1989).

W.C. Dautremont–Smith et al., Hydrogen Passivation of Acceptors in p–InP, J. Appl. Phys. 66, 1993, (1989).

(List continued on next page.)

*Primary Examiner*—David Nelms
*Assistant Examiner*—Thao Le
(74) *Attorney, Agent, or Firm*—Koppel, Jacobs, Patrick & Heybl

(57) ABSTRACT

A method for protecting the surface of a semiconductor material from damage and dopant passivation is described. A barrier layer of dense or reactive material is deposited on the semiconductor material shortly after growth in a growth reactor such as a MOCVD reactor, using the MOCVD source gasses. The barrier layer blocks the diffusion of hydrogen into the material. The reactor can then be cooled in a reactive or non-reactive gas ambience. The semiconductor material can then be removed from the reactor with little or no passivation of the dopant species. The barrier layer can be removed using a variety of etching processes, including wet chemical etching or can be left at the semiconductor material for surface protection. The barrier layer can also be a gettering layer that chemically binds hydrogen trapped in the semiconductor material and/or blocks hydrogen diffusion into the material.

13 Claims, 3 Drawing Sheets

OTHER PUBLICATIONS

Amano et al., P-type Conduction in MG-doped GaN Treated With Low-Energy Electron Beam Irradiation (LEEBI), Japanese Journal of Applied Physics, vol. 28, No. 12, pp. L2112–L2114) (Dec. 1989).

J. Kim et al., Low Resistance Pd/Au Ohmic Contacts to P–Type GaN Using Surface Treatment, Appl. Phys. Lett. 73, 2953 (1998).

S. Minagawa and M. Kondow, Effect of Substrate Orientation on Zn–Doping Of AlGaInP Grown by Atmospheric Pressure Orgamometallic Vapor Phase Epitaxy, J. Electronic Materials, vol. 19, No. 6, pp 597–599 (1990).

W.C. Dautremont–Smith, Mater. Hydrogen In III–V Semiconductors Res. Soc. Symp. Proc. vol. 104, p. 313–323 (1998).

* cited by examiner

FABRICATION OF SEMICONDUCTOR MATERIALS AND DEVICES WITH CONTROLLED ELECTRICAL CONDUCTIVITY

This application is a continuation of U.S. patent application Ser. No. 09/644,875 filed Aug. 23, 2000 now U.S. Pat. No. 6,498,111 and claims priority of that application.

This invention was made with Government support under Contract Nos. F33615-98-C-1328 and N00014-97C-0203, awarded by the ONR. The Government has certain rights in this invention.

BACKGROUND OF THE INVENTION

1. Field of the Invention

This invention relates to a method for achieving the desired electrical conductivity in doped semiconductor materials that are affected by dopant passivation. The invention specifically teaches methods of fabricating passivation-barrier layers to prevent or reduce doping species passivation during the semiconductor growth process, thus eliminating the need for in-situ or ex-situ annealing steps.

2. Description of the Related Art

Semiconductor materials are essential for producing light emitting diodes (LEDs), laser diodes (LDs) and other optoelectronic and electronic devices because the electrical and optical properties of the material can be controlled through composition and structural variation. To achieve this control, it is important to produce semiconductor material free of undesired impurities. Gallium nitride (GaN) is one of the most promising semiconductor materials for application to blue, violet and ultraviolet (UV) LEDs and LDs as well as other electronic devices.

During growth of GaN p-n junction diodes using Metal-Organic Chemical Vapor Deposition (MOCVD), it is difficult to grow a p-type material with good structural, optical, and electrical integrity. The p-type region of a GaN junction diode is commonly grown in a MOCVD reactor by adding magnesium (Mg) to achieve the desired conductivity. However, a common problem is electrical passivation of acceptors like Mg, zinc (Zn), carbon (C) and others by hydrogen atoms. The smaller hydrogen atoms diffuse into the GaN material, where they neutralize the Mg acceptors and the holes produced by the Mg. The passivation process leaves the Mg acceptors inactive, resulting in the material becoming insulating or weakly p-type in its as grown state. The passivation of the p-type region results in critical performance problems for the diode. Hydrogen passivation of acceptors and donors has been reported for a wide variety of semiconductors including silicon [S. J. Pearton et. al., Appl. Phys. A 43, 153 (1987)], gallium arsenide [N. M. Johnson et. al., Phys. Rev. B 33, 1102 (1986); W. C. Dautremont-Smith, J. Appl. Phys. 66, 1993 (1989)], indium phosphide [G. R. Antell et. al., Appl. Phys. Lett., 53, 758 (1988)], and cadmium telluride [L. Svob et. al., J. Cryst. Growth 86, 815 (1988)]. Passivation has been demonstrated both intentionally and unintentionally as a result of the epitaxial growth process.

The growth of GaN diodes represents one example where hydrogen passivation plays an important role. It has been shown that passivation of acceptors occurs after growth, during the reactor cooling stage. [G. R. Antell et al., Appl. Phys. Lett. 73, 2953 (1998)]. Hydrogen is common in a MOCVD reactor during growth of the GaN material and subsequent reactor cooling, generally coming from two sources. Hydrogen is commonly used during growth as a carrier gas for the growth source gasses. In addition, ammonia ($NH_3$) is used as a source gas for nitrogen (N) during growth of the GaN material and is also used to stabilize the GaN material during reactor cooling. Hydrogen is produced as a by-product of the ammonia decomposition during growth and cooling. In the conventional GaN growth process, there is sufficient hydrogen in the reactor to cause passivation of the p-type region during cooling.

Passivation of the p-type region could be avoided by removing the hydrogen source from the reactor prior to cool down. See U.S. Pat. No. 5,891,790, to Keller et. al. However, the GaN crystal is unstable at growth temperatures and the p-type GaN region is susceptible to decomposition which results in surface damage. The conventional method for avoiding this decomposition is to maintain the flow of $NH_3$ during reactor cooling. However, the presence of $NH_3$ during reactor cooling produces hydrogen and leads to passivation. As such, it was thought that the removal of all hydrogen sources was not practical and that passivation during reactor cooling could not be avoided.

As opposed to avoiding passivation, various methods were developed to reverse the passivation after material growth and reactor cooling. Much of the early studies of dopant passivation revealed the utility of thermal annealing for removal of the hydrogen and "activation" of the dopants [G. R. Antell et. al., Appl. Phys. Lett., 53, 758 (1988); W. C. Dautremont-Smith, Mater. Res. Soc. Symp. Proc. 104, 313 (1988); T. Zundel and J. Weber, Phys. Rev. B 39, 13549 (1988); W. C. Dautremont-Smith et. al., J. Appl. Phys. 66, 1993 (1989)]. Once the phenomenon of hydrogen passivation was recognized, it became evident that the hydrogen could be diffused into and out of the semiconductor at elevated temperatures, resulting in passivation or activation of the dopants. Consequently, thermal annealing was utilized as a method for acceptor and donor activation in group IV, III–V, and II–VI semiconductor materials. Acceptor passivation in Gallium Nitride could also be reversed using Low-Energy Electron Beam Irradiation (LEEBI) [Amano et. al., Japanese Journal of Applied Physics, Vol. 28, No. 12, pp. L2112–L2114 (December 1989)]. In LEEBI treatment, the passivated GaN material is irradiated with an electron beam to activate the acceptors. While these procedures effectively activate the passivated region, they are conducted ex situ, introducing another step in the fabrication process that increases cost and reduces yield. Damage can be caused from handling, and impurities can be introduced by atmospheric conditions. Both processes expose the GaN material to high temperature, which can also damage the material.

In addition, the annealing process occurs prior to p-contact metalization. In devices such as GaN LEDs and LDs, it is important to provide reproducible low-resistance contacts. Metal contacts to p-type GaN have been found to be highly sensitive to surface quality. [J. Kim et. al. Appl. Phys. Lett. 73, 2953 (1998)]. Thus, any damage to the p-type surface during annealing or handling will adversely impact the p-type metal contacts.

Another method for reducing passivation of acceptors during reactor cooling is capping the p-type material with a thin n-type layer. [S. Manigawa and M. Kondo, J. Electron. Mater. Vol. 19 No. 6, pp. 597–599 (1990)]. The solubility of hydrogen in the n-type material is low compared to the p-type material, so diffusion of hydrogen during reactor cooling is greatly reduced. However, this process does not completely eliminate the passivation of the p-type material and removal of the n-type material by etching is difficult and can damage the p-type surface.

SUMMARY OF THE INVENTION

The present invention provides a novel method of achieving the desired electrical conductivity in doped semiconductor materials that experience passivation of the doping species by hydrogen atoms. Passivation occurs by hydrogen being incorporated into the semiconductor material in association with doping species.

The invention specifically teaches methods of fabricating barrier layers to prevent or reduce the diffusion and incorporation of hydrogen into the semiconductor material, thus preventing or reducing dopant passivation. The barrier layers are fabricated in the same growth chamber that is used for the semiconductor material growth. Shortly after the growth of the material, while it is in the reactor and the reactor is at a temperature about equal to or lower than the growth temperature, the diffusion barrier layer is deposited on the material. The barrier layer is formed from dense, inert compounds that block the diffusion and incorporation of hydrogen into the material. Examples for barrier layers are Si, Ge, MgOx, MgNx, ZnO, SiNx, SiOx, alloys or layer sequences thereof.

The barrier layer can also be a hydrogen binding layer, also referred to as a hydrogen-gettering layer. The hydrogen-gettering layer chemically binds hydrogen trapped in the semiconductor or prevents hydrogen from reaching the semiconductor surface from the ambient gas phase, thus preventing hydrogen diffusion into the semiconductor. The composition of the gettering layer compounds can be adjusted during growth to contain an excess of the gettering component. The preferred gettering layer materials contain components that have a high binding energy to atomic hydrogen. The binding energy is also preferably higher than the binding energy between hydrogen and the acceptor or donor species. Thus, the layer can be effective in preventing the passivation of doping species by gettering the hydrogen. The layer can have multiple layers that can be a repeated sequence of multiple gettering materials.

After cool-down, any of the barrier layers may be removed by one of a variety of etching techniques for subsequent processing of the semiconductor material.

Eliminating passivation of the semiconductor material also can eliminate or reduce the need for additional processing steps such as thermal or electron beam annealing. The method also provides superior quality and yield in semiconductor materials, preserving the material in its pristine as grown state.

These and other further features and advantages of the invention will be apparent to those skilled in the art from the following detailed description, taken together with the accompanying drawings, in which:

DETAILED DESCRIPTION OF THE INVENTION

The present invention is a novel method for preventing the passivation of dopant species in semiconductor materials by atomic hydrogen. A barrier layer is grown soon after the growth of the semiconductor material, prior to or during reactor cooling, or at a temperature lower than the growth temperature of the semiconductor material. The barrier layer functions as a dense barrier for diffusion of hydrogen into the semiconductor. The barrier layer can also serve as a gettering layer to chemically bind hydrogen. In both cases the passivation of doping species is prevented or reduced. Following reactor cooling and prior to further processing of the materials, the barrier layer can be removed by known procedures such as etching.

The barrier or gettering layer can be deposited on the semiconductor material using MOCVD, plasma chemical vapor deposition (CVD), hot-filament CVD, or other deposition processes. The preferred method is deposition in a MOCVD reactor.

Figure 1:
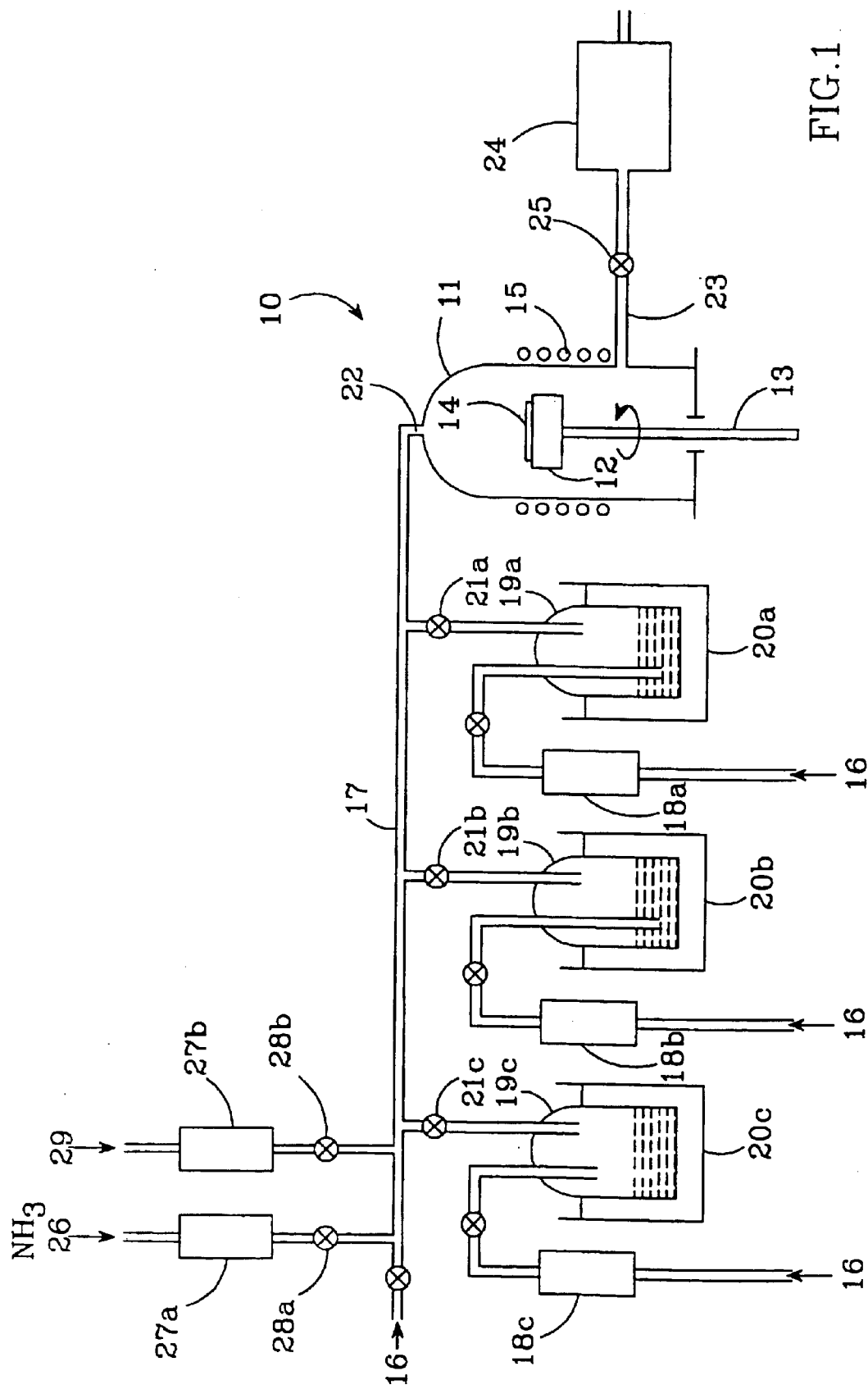
FIG. 1 is a simplified schematic of a MOCVD reactor used in growing semiconductor material.

FIG. 1 shows a MOCVD reactor 10 used in the new method to grow the semiconductor material and to apply the barrier layer. The reactor 10 comprises a reaction chamber 11 having growth platform 12 supported by a rotary shaft 13. In most applications a single crystal 14 such as sapphire is disposed on the growth platform 12, although other crystals may be used such as AlGaN, or GaAs. During growth, the platform 12 is heated by heater 15 to maintain substrate 14 at a predetermined temperature. The temperature is typically between 400 and 1200 degrees centigrade (° C.), but can be higher or lower depending on the type of growth desired. The heater 15 can be a variety of heating devices but is usually a radio frequency (RF) or resistance coil.

A carrier gas 16 is supplied to a gas line 17, the carrier gas being a gas such as hydrogen or nitrogen. The carrier gas 16 is also supplied through mass flow controllers 18a–c to respective bubblers 19a–c. Bubbler 19a has a growth compound, typically an alkylated compound having a methyl or ethyl group, e.g. trimethyl gallium TMG), trimethyl aluminum (TMA) or trimethyl indium (TMI). Bubblers 19b and 19c may also contain a similar metalorganic compound to be able to grow an alloy of a Group III compound. The bubblers 19a–c are typically maintained at a predetermined temperature by constant temperature baths 20a–c to ensure a constant vapor pressure of the metal organic compound before it is carried to the reaction chamber 11 by the carrier gas 16.

The carrier gas 16 which passes through bubblers 19a–c is mixed with the carrier gas 16 flowing within the gas line 17 by opening the desired combination of valves 21a–c. The mixed gas is then introduced into the reaction chamber 11 through a gas inlet port 22 formed at the upper end of the reaction chamber 11.

A nitrogen containing gas 26 such as ammonia is supplied to the gas line 17 through a mass flow controller 27a and the flow of nitrogen containing gas is controlled by valve 28a. If the carrier gas 16 is mixed with the nitrogen containing gas 26, and the TMG vapor within the gas line 17 is introduced into the reaction chamber 11, the elements are present to grow gallium nitride on the substrate 14 through thermal decomposition of the molecules in the TMG and ammonia contain gas.

To dope alloys of gallium nitride on the substrate 14, one of the bubblers 19a–c not being used for the TMG is used for a dopant material, which is usually Magnesium (Mg) or Silicon (Si), but can be other material such as beryllium, calcium, zinc, or carbon. Bubbler 19b or 19c is used for an alloy material such as boron, aluminum, indium, phosphorous, arsenic or other materials. Once the dopant and alloy are selected and the valve 21a, 21b or 21c is opened to allow the dopant to flow into gas line 17 with the gallium and nitrogen containing gas 26, the growth of the doped layer of gallium nitride takes place on substrate 14.

The gas within the reaction chamber 11 can be purged through a gas purge line 23 connected to a pump 24 operable under hydraulic pressure. Further, a purge valve 25 allows gas pressure to build up or be bled off from the reaction chamber 11.

The growth process is typically stopped by shutting off the gallium and dopant sources by closing valves 21a and 21b, and keeping the nitrogen containing gas and the carrier gas flowing. Alternatively, the reaction chamber 11 can be purged with a gas 29 that can be controlled through a mass flow controller 27b and valve 28b. The purge is aided by opening valve 25 to allow the pump 24 to evacuate the reaction chamber 11 of excess growth gasses. Typically, the purge gas 29 is hydrogen, but can be other gasses. Turning off the heater 15 power then cools the substrate 14.

In the new method, the application of the barrier layer occurs after growth of the semiconductor material and prior to or during cooling of the reaction chamber 11. Following growth of the semiconductor material in a reactor chamber 11, the flow of undesired growth gasses is discontinued by closing the appropriate combination of valves 21a–c. A short purge of the reactor may be completed to remove the undesirable gasses as described above. Gasses are then flowed into the reactor to deposit an epitaxial, polycrystalline, or amorphous barrier layer on the device. In the preferred method, the gasses used for the barrier layer are provided from typical MOCVD sources.

The barrier layer should be a dense material that uniformly covers the semiconductor surface and that should not adversely impact the properties and performance of the semiconductor material and device. The composition and thickness of the barrier layer or barrier layer sequence is chosen such that hydrogen is effectively prevented from passivating the doping species in the semiconductor material or significantly reducing the extent of the passivation. Examples of some of the compounds that can be used in the invented process include Si, Ge, $MgO_x$, $MgN_x$, ZnO, $SiN_x$, $SiO_x$, and alloys thereof. Multiple layer and repeated stacks of layers of suitable materials can be used as barrier layers as well, such as $SiN_x/Si$, $MgN_x/SiN_x$ or $MgN_x/MgO_x$. The different barrier layers can be formed from the following source gasses: Si from silane or disilane, Ge from germane, $MgN_x$ from cyclopentadienyl magnesium or methyl-cyclopentadienyl magnesium and ammonia, MgO from cyclopentadienyl magnesium or methyl-cyclopentadienyl magnesium and nitrous oxide, ZnO from dimethyl zinc or diethyl zinc and nitrous oxide or water, $SiN_x$ from silane or disilane and ammonia or nitrous oxide, and $SiO_x$ formed from silane or disilane and nitrous oxide.

After the protective barrier layer is applied, the semiconductor material can be cooled in the reaction chamber 11 without or with reduced dopant passivation. The semiconductor material can then be removed from the cooled reaction chamber 11.

When the structure is ready for additional processing such as metalization, the barrier layer can be removed by a number of different methods including but not limited to wet chemical hydrofluoric acid (HF) etching, reactive ion etching, or plasma etching.

The invention applies to devices such as high electron mobility transistors (HEMTs) and metal-semiconductor field effect transistors (MESFETs), semiconductor laser diodes, light emitting diodes (LEDs), optical detectors, and bipolar junction transistors (BJTs).

Figure 2:
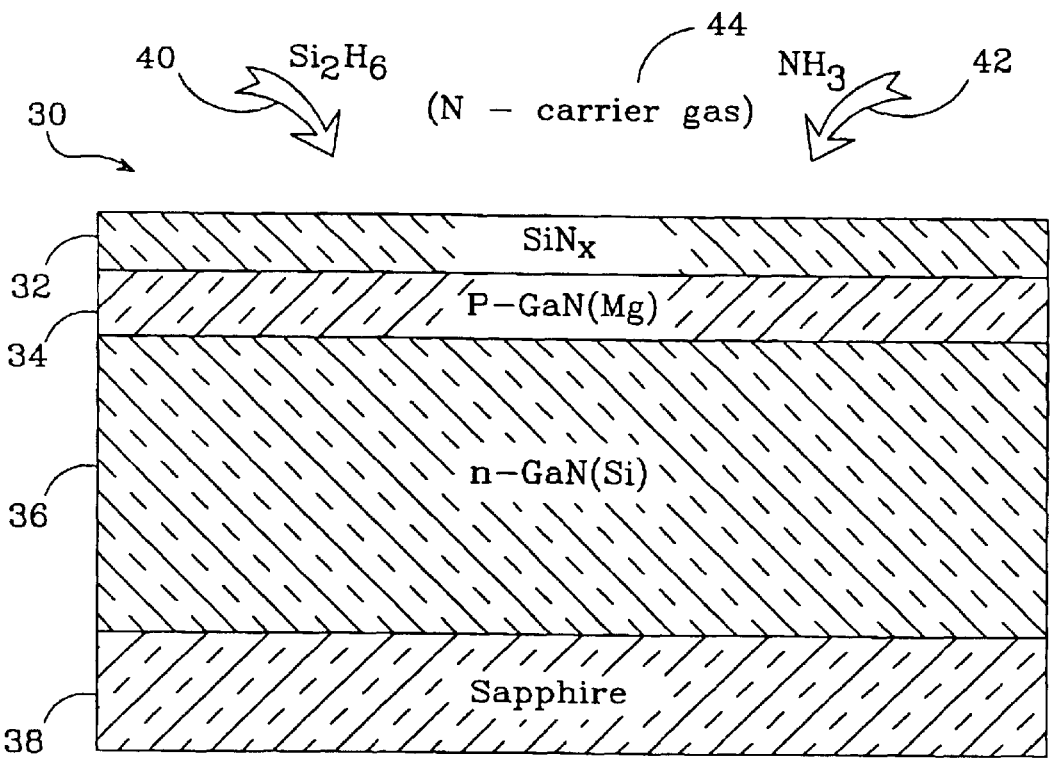
FIG. 2 is a sectional view of a p-n junction diode with the with a barrier $SiN_x$ layer.

A preferred application of this method is passivation prevention or reduction in GaN p-n junction diodes. FIG. 2 shows a layer diagram of a GaN p-n junction diode 30 with the barrier layer 32 applied. Although a variety of barrier layer compounds may be applied, the preferred passivation barrier compounds are $MgN_x$, Si and $SiN_x$ for a number of reasons; the necessary source gasses are already present in the reactor, they are chemically inert to GaN, and they are easily removed by etching. The barrier layer 32 is deposited on the p-type GaN region 34 doped with Mg. Also shown is the n-type GaN region 36 doped with Si grown on a sapphire substrate 38 as described above.

In the preferred method, the GaN crystal is grown in the reaction chamber 11 at temperatures of about 1000° C. Following growth, the flow of source gasses used to grow the GaN material are stopped at valves 21a–c. The flow of nitrogen containing gas ($NH_3$) 26 is maintained because of the unstable nature of GaN at high temperature. A short reactor purge of approximately 1–3 seconds may be performed using valve 25 and pump 24 to remove the source gasses used in the growth of GaN. The short purge provides a distinct junction between the $SiN_x$ protective layer 32 and the p-type GaN 34 region, which helps to prevent Si doping of the p-type region 34. The barrier layer is then deposited on the GaN material. For the fabrication of a $SiN_x$ layer 32 silane ($SiH_4$) or disilane ($Si_2H_6$) gas 40 is used in combination with ammonia ($NH_3$) 42 at the growth temperature of the semiconductor material or at a different temperatures down to approximately 700° C. or lower. For the fabrication of Si, the $NH_3$ flow 42 is terminated and $SiH_4$ or $Si_2H_6$ 40 are sourced into the reaction chamber. For the fabrication of $MgN_x$, cyclopentadienyl magnesium ($Mecp_2Mg$) and $NH_3$ are sourced into the reaction chamber 11, respectively. The silicon, magnesium, and ammonia sources are typically installed in MOCVD systems and used for the growth of group III nitride based semiconductors such as GaN and its alloys with indium and aluminum. No additional source materials need to be added to the MOCVD system for the fabrication of the preferred barrier layers. Thus an easier, and more cost effective method is provided to prevent the passivation of doping species in semiconductor material grown by MOCVD compared to prior art.

In the preferred embodiment, a nitrogen carrier gas 44 is used during growth of the protective layer, although other gasses could also be used. Hydrogen is not used because passivation of the p-type layer 34 may occur in the short time between the end of growth of the diode 30 and the deposition of the sufficiently thick barrier layer 32. A 2–500 nm thick barrier layer 32 is usually sufficient to protect the GaN surface, so the deposition can be performed quickly if sufficient barrier layer source gasses are provided. A variety of barrier layer thicknesses can be used. In some applications a barrier layer only a few angstroms thick would be sufficient. The thicker the barrier layer or barrier layer stack, the more effective the passivation of doping species is prevented. However, if too thick a barrier layer 32 is applied, damage to the diode 30 may occur during barrier growth or reactor cooling.

A wide range of reactor chamber 11 conditions can be used for the. $MgN_x$, Si, or $SiN_x$ deposition, so the protective layer 32 can usually be deposited using the same growth conditions as the final diode layer. Reaction chamber 11 conditions may also be varied during deposition of the protective layer 32 to provide the greatest benefit for the application. As an example, the deposition may be performed during reaction chamber cooling in order to minimize the thermal residence time of the device. Alternatively, the temperature may be maintained during deposition if thermal residence is not a critical issue.

Once the passivation barrier layer 32 is deposited, the reaction chamber ambient may be modified to suit the limitations of the device application. In one preferred method, once the MgNx, Si, and SiNx barrier layer or layer sequence has been deposited, the ambient gas can be changed to a non-reactive gas such as nitrogen, helium, argon, or mixtures thereof. This ambient change can facilitate the purging of source gasses from the reactor chamber and the stabilization of either the semiconductor or barrier layer material during the cool down process. In the preferred method the ambient is nitrogen, helium, argon or a mixture of these gases. This process allows significant flexibility in reactor conditions following the deposition of the barrier layer 32 without the danger of damaging the semiconductor or the barrier layer material. In another preferred embodiment, after completion of the barrier layer the ambient gas may be changed to reactive gasses like nitrous oxide, oxygen, hydrogen, mixtures thereof or mixtures with non-reactive gasses.

After the reactor is cooled and the semiconductor device is removed from the reaction chamber 11 the passivation barrier layer 32 can remain on the surface. This offers the added benefit of preserving the grown semiconductor material and sensitive surface properties from contamination prior to the subsequent device fabrication steps.

Figure 3:
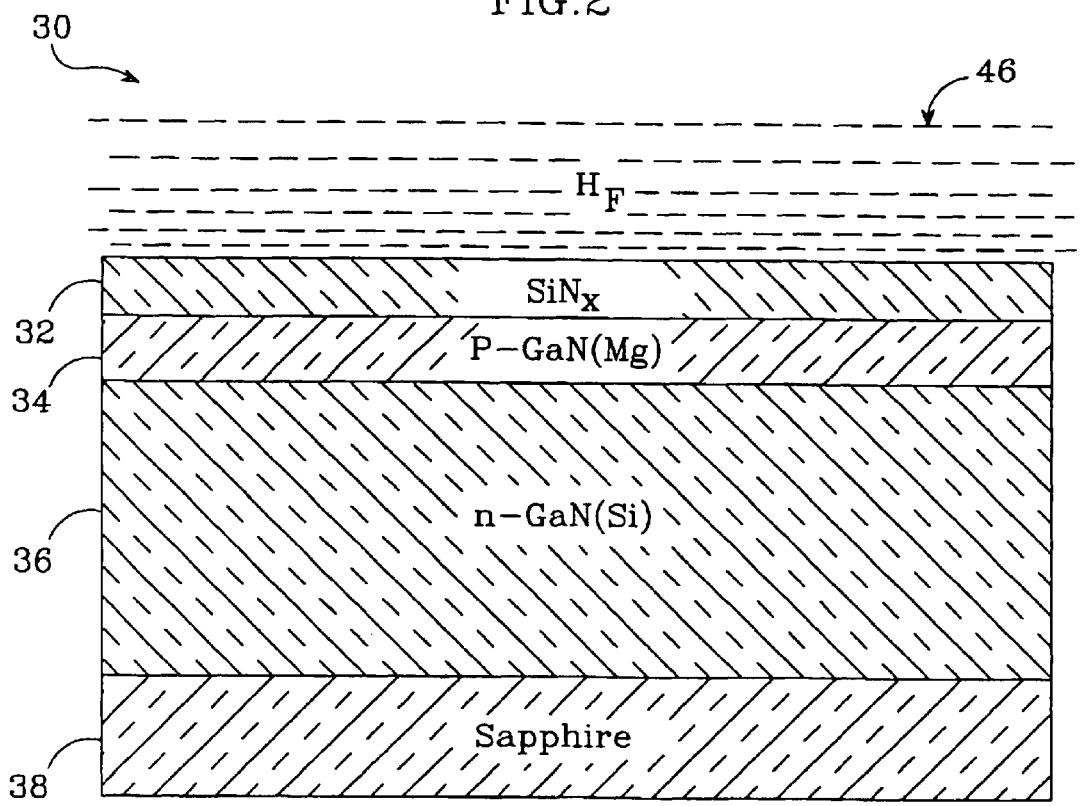
FIG. 3 is a sectional view of the p-n junction diode of FIG. 2 immersed in HF to remove the protective $SiN_x$ layer.

The barrier layer 32 may be removed immediately prior to further processing steps such as metalization of contacts. In the preferred method, the barrier layer 32 is removed with wet chemical hydrofluoric acid (HF) etching. FIG. 3 shows the diode 30 in the HF wet chemical 46 that will dissolve the protective layer. The use of a wet chemical etching is preferred because it leaves the semiconductor surface pristine, while other etching processes may introduce impurities or cause damage to the material surface. Any processing steps should be conducted as soon as possible after removal of the barrier layer 32 to avoid damage to the surface from handling or exposure to atmospheric conditions.

The new method provides other benefits beyond those already discussed. If the device is exposed to extreme conditions following growth such as diffusion of an impurity, or annealing for defect reduction, the barrier layer 32 should retard damage to the surface. If slow, highly controlled cooling is desired to minimize residual thermal stresses the additional thermal budget should not affect the device surface once the barrier layer 32 is deposited. Diffusion of other impurities from the reactor ambient into the device following growth will be eliminated. Densities of surface electron states resulting from surface damage should be significantly reduced. Surface damage of p-type layers that can result in the formation of thin n-type layers (which increases contact resistance) are minimized.

Figure 4:
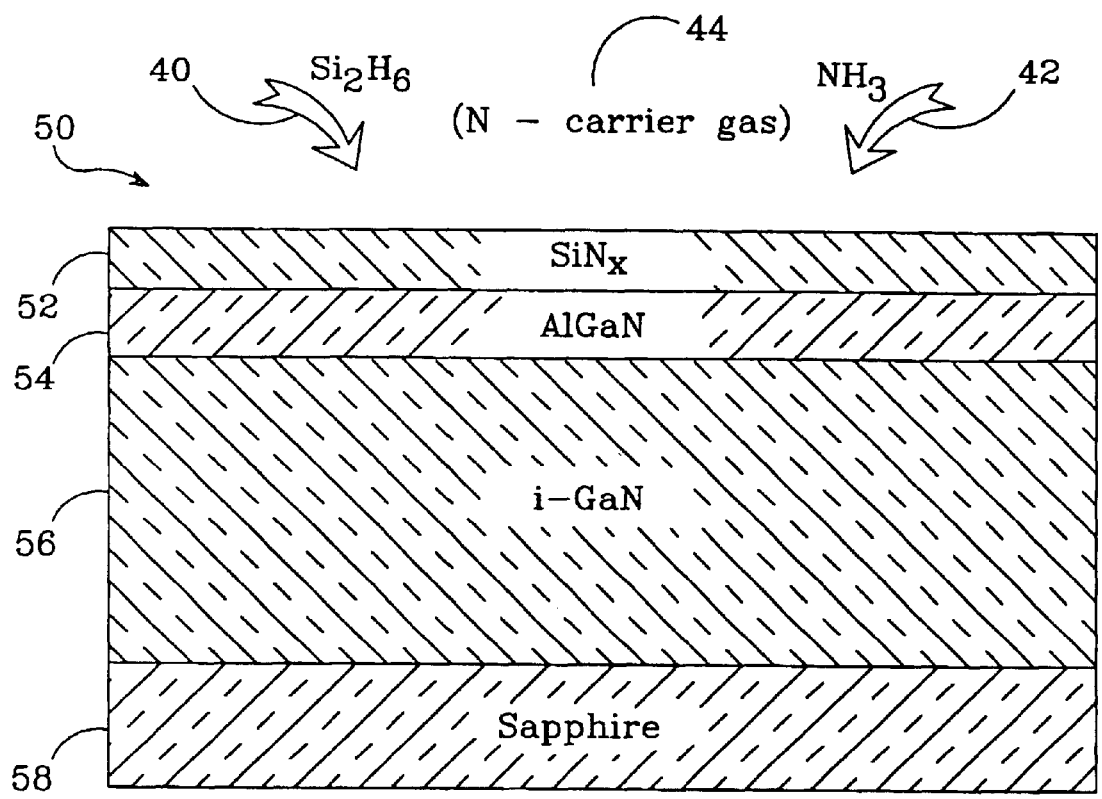
FIG. 4 is a sectional view of p-n junction diode with a hydrogen-binding (gettering) layer.

In another preferred method, the composition of the barrier layer compounds can be adjusted during growth to contain an excess of gettering components by selecting proper ratios of the corresponding source gasses. FIG. 4 shows a p-n junction diode 50 similar to the diode in FIGS. 2 and 3, having a hydrogen binding/gettering layer 52 on its surface. The diode also has a AlGaN layer 54, a GaN layer 56, and a sapphire substrate 58. The binding/gettering layer 52 is deposited on diode 50 using MOCVD source gasses 40, 42 in a N carrier gas 44. The layer 52 is used for blocking or reducing the diffusion of hydrogen into the semiconductor and also for gettering hydrogen at the semiconductor interface with the ambient. The preferred gettering layer material contains components that have a high binding energy to atomic hydrogen and higher than the binding energy between hydrogen and the acceptor or donor species (e.g. Mg—H bond=126 kJ/mol). In the case of GaN materials, the binding energy between the gettering layer constituents and hydrogen exceeds the energy between Mg and hydrogen (e.g. Si—H=318 kJ/mol; Ge—H=321 kJ/mol; N—H=339 kJ/mol; O—H=427 kJ/mol). Thus the layers can be effective in preventing the passivation of doping species by gettering the hydrogen. The gettering layer can have different layers that can be a repeated sequence of multiple gettering materials. When further processing of the diode 50 is desired, the gettering layer 52 is removed by wet chemical HF etching, but can also be removed by other etching processes.

Although the present invention has been described in considerable detail with reference to certain preferred configurations thereof, other versions are possible. Therefore, the spirit and scope of the appended claims should not be limited to their preferred versions contained therein.

We claim:

1. A method for preventing the passivation of acceptor and donor species in semiconductor materials during and after its growth in a reactor, comprising:

flowing growth source gasses into said reactor for growth of said semiconductor material;

growing said semiconductor material in said reactor;

stopping the flow of said material growth source gasses into said reactor that are not necessary for stabilization of said semiconductor material, while maintaining the flow of non-hydrogen carrier gas into said reactor;

injecting passivation barrier layer source gasses into said reactor to deposit a passivation barrier layer on said semiconductor material, while said semiconductor material is in said reactor;

depositing said passivation barrier layer on said semiconductor material while said material is in said reactor, said passivation barrier layer being capable of preventing hydrogen from diffusing into said semiconductor material; and removing said passivation barrier layer after cooling of said reactor, to further process said semiconductor material.

2. The method of claim 1, wherein said passivation barrier layer is deposited by MOCVD, plasma CVD, hot-filament CVD or PVD.

3. The method of claim 1, wherein said protective passivation barrier layer comprises Si, Ge, MgOx, MgNx, ZnO, SiNx, SiOx, and alloys thereof.

4. The method of claim 1, where said passivation barrier layer comprises at least two layers, each said layer made from Si, Ge, $MgO_x$, $MgN_x$, ZnO, $SiN_x$, $SiO_x$, or alloys thereof.

5. The method of claim 1, wherein said passivation barrier layer comprises $SiN_x$.

6. The method of claim 1, wherein said passivation barrier layer is 1–500 nm thick.

7. The method of claim 1, wherein said reactor contains an ambient gas after the formation of said passivation barrier layer, said ambient gas being a non-reactive gas.

8. The method of claim 7, wherein said non-reactive gas is nitrogen, helium, argon or mixtures thereof.

9. The method of claim 1, wherein said reactor contains an ambient gas after the formation of said passivation barrier layer, said ambient gas being a reactive gas.

10. The method of claim 9, wherein said reactive gas is nitrous oxide, oxygen, hydrogen, mixtures thereof, or mixtures with said non-reactive gasses.

11. The method of claim 1, wherein said passivation barrier layer is removed by etching using wet chemical etching, reactive ion etching or plasma etching.

12. The method of claim 1, wherein said passivation barrier layer is removed by wet chemical hydrofluoric acid (HF) etching.

13. The method of claim 1, wherein high electron mobility transistors (HEMTs), metal-semiconductor field effect transistors (MESFETs), laser diodes (LDs), light emitting diodes (LEDs), optical detectors, and bipolar junction transistors (BJTs) or similar semiconductor devices are formed in said semiconductor material.

* * * * *